United States Patent [19]

Komatsu et al.

[11] Patent Number: 5,083,171

[45] Date of Patent: Jan. 21, 1992

[54] IMAGE SENSOR

[75] Inventors: Katsuaki Komatsu; Hideo Watanabe, both of Hino, Japan

[73] Assignee: Konica Corporation, Tokyo, Japan

[21] Appl. No.: 534,320

[22] Filed: May 29, 1990

Related U.S. Application Data

[63] Continuation of Ser. No. 337,210, Apr. 12, 1989, abandoned.

[30] Foreign Application Priority Data

Apr. 20, 1988 [JP] Japan .................................. 63-95764

[51] Int. Cl.$^5$ .......................................... H01L 29/48
[52] U.S. Cl. .......................................... 357/15; 357/30; 357/2; 357/4
[58] Field of Search ................. 357/2, 15, 30 C, 30 H, 357/30 K, 30 R, 59 R, 59 B, 59 C, 4

[56] References Cited

U.S. PATENT DOCUMENTS

| | | | |
|---|---|---|---|
| 4,251,289 | 2/1981 | Moustakas et al. | 357/30 F |
| 4,492,810 | 1/1985 | Ovshinsky et al. | 357/30 |
| 4,732,873 | 3/1988 | Perbet et al. | 357/59 B |
| 4,764,682 | 8/1988 | Swartz | 357/30 |
| 4,811,069 | 3/1989 | Kakinuma | 357/15 |
| 4,868,616 | 9/1989 | Johnson et al. | 357/59 |

FOREIGN PATENT DOCUMENTS

| | | | |
|---|---|---|---|
| 58-48962 | 3/1983 | Japan | 357/30 |
| 59-119759 | 7/1984 | Japan | 357/30 |
| 62-35670 | 2/1987 | Japan | 357/2 |
| 63-119259 | 5/1988 | Japan | 357/2 |

OTHER PUBLICATIONS

Sze, *Semiconductor Devices: Physics and Technology*, 1985, p. 1.

Primary Examiner—Andrew J. James
Assistant Examiner—Courtney A. Bowers
Attorney, Agent, or Firm—Finnegan, Henderson, Farabow, Garrett, and Dunner

[57] ABSTRACT

In an image sensor, photoelectric transducers each consisting of a pair of a photodiode and a blocking diode, each of which has a semiconductor layer of an amorphous silicon thin film and two opposing electrodes sandwiching the semiconductor layer therebetween, are aligned in an array on a single substrate and are driven by matrix-wirings. One of the two electrodes serves as a light-receiving side electrode and the other electrode serves as an ohmic contact electrode. One of the light-receiving side electrode and the ohmic contact electrode is formed common to the pair of the photodiode and the blocking diode. Each of the photodiode and the blocking diode is formed by a Schottky junction between the semiconductor layer and the light-receiving side electrode.

2 Claims, 3 Drawing Sheets

IMAGE SENSOR

This application is a continuation of application Ser. No. 07/337,210 filed Apr. 12, 1989, abandoned.

BACKGROUND OF THE INVENTION

1. Field of the Invention

The present invention relates to an image sensor such as a proximity image sensor which performs photoelectric conversion while almost contacting an original including image data.

2. Description of the Prior Art

An apparatus having an image data reading function such as a facsimile system or scanner employs a solid-state image sensor for reading image data. Solid-state image sensors used for reading image data include a CCD image sensor and a MOS image sensor. These sensors are used as reduction type image sensors which receive a reduced original image through an optical system, and photoelectrically convert the received image. An apparatus such as a facsimile system assembled with the reduction type image sensor is advantageous in terms of cost. However, such an apparatus has a size limitation since it requires an optical system and a given optical path length.

For meeting the requirement of reducing the apparatus in size, a proximity image sensor which does not require an optical system and a large optical path length, has a length equal to a reading width of an original, and almost contacts an original to read and photoelectrically convert image data has been developed and is commercially available (e.g., Journal of Society of Image Electronics, Vol. 15, pp. 17-26 issued in January, 1986, and Journal of Society of Television, Vol. No. 6, pp. 512-519 issued in June, 1984).

Proximity image sensors can be classified into several types in view of materials, photoelectric conversion/scanning mode, optical systems, and the like. Among these sensors, an accumulation type matrix-drive amorphous silicon image sensor has been receiving a lot of attention. This image sensor employs an amorphous silicon thin film which has good workability, whose nature as a semiconductor film is easily controlled, and which can have a large-area, elongated structure. The image sensor requires smaller numbers of drive ICs and connection wirings with respect to the number of pixels.

This matrix-drive image sensor has such structure that a plurality of photodiodes which are adapted to receive and photoelectrically convert light corresponding in amount to image data for each pixel is aligned in an array, and a blocking diode is arranged opposite to each photodiode and some pairs of photodiodes and blocking diodes are connected in matrix configuration as one unit or block. The blocking diodes are provided to prevent crosstalk between pixels of different blocks which are wired in common and to hold the photodiodes in a reverse bias state, and to separate them from other pixels during an accumulation period. FIG. 1 shows an example of a photoelectric conversion section of a known matrix-drive image sensor.

In the photoelectric conversion section of the matrix-drive image sensor shown in FIG. 1, a lower Cr electrode 2 is formed on a glass substrate 1. A photodiode 3 and a blocking diode 4 which have a pin structure and are formed of an amorphous silicon thin film are formed on the lower electrode 2 to be separated at a distance. An indium-tin-oxide (ITO) transparent conductive film 5 is formed on each of the diodes 3 and 4. Both the diodes are covered with an insulating layer 6 except for the portions of the transparent conductive films 5. Upper electrodes 7 are formed on the insulating layer 6 so that one end of each electrode 7 is connected to the corresponding diode. Diode pairs thus formed are aligned in an array in units of pixels.

FIG. 2 is a plan view showing the matrix-drive image sensor having the array structure for some pixels (three pixels in FIG. 2).

As can be seen from FIG. 1, in the conventional image sensor, the lower electrode 2, the pin photodiode 3, the pin blocking diode 4, the transparent conductive film 5, the insulating film 6, and the upper electrodes 7 are formed in different photoresist steps using different masks. Therefore, the number of steps is increased, resulting in high cost.

SUMMARY OF THE INVENTION

It is an object of the present invention to provide an image sensor which can reduce the number of photoresist steps and can omit an insulating layer. In order to achieve this object, each of a photodiode and a blocking diode comprising a photoelectric conversion section of a matrix-drive image sensor is formed by a Schottky junction formed between an amorphous silicon thin film and a light-receiving side electrode.

More specifically, in order to achieve the above object, there is provided an image sensor in which photoelectric transducers, each consisting of a pair of a photodiode and a blocking diode, each of which has a semiconductor layer of an amorphous silicon thin film and two opposing electrodes sandwiching the semiconductor layer therebetween, are aligned in an array on a single substrate and are driven by matrix-wirings, wherein one of the two electrodes serves as a light-receiving side electrode and the other electrode serves as an ohmic contact electrode, one of the light-receiving side electrode and the ohmic contact electrode is formed common to the pair of the photodiode and the blocking diode, and each of the photodiode and the blocking diode is formed by a Schottky junction between the semiconductor layer and the light-receiving side electrode.

DETAILED DESCRIPTION OF THE PREFERRED EMBODIMENTS

The present invention will now be described with reference to the accompanying drawings.

Figure 1:
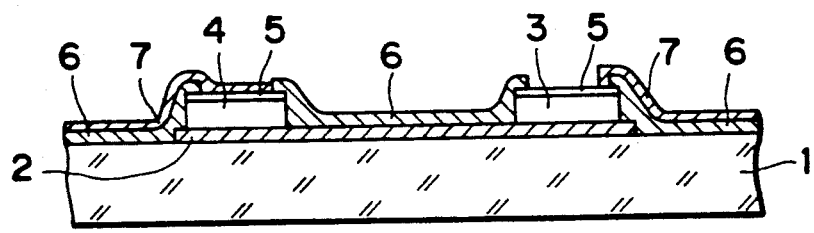
FIG. 1 is a partial sectional view of a photoelectric conversion section of a conventional matrix-drive image sensor.
Figure 2:
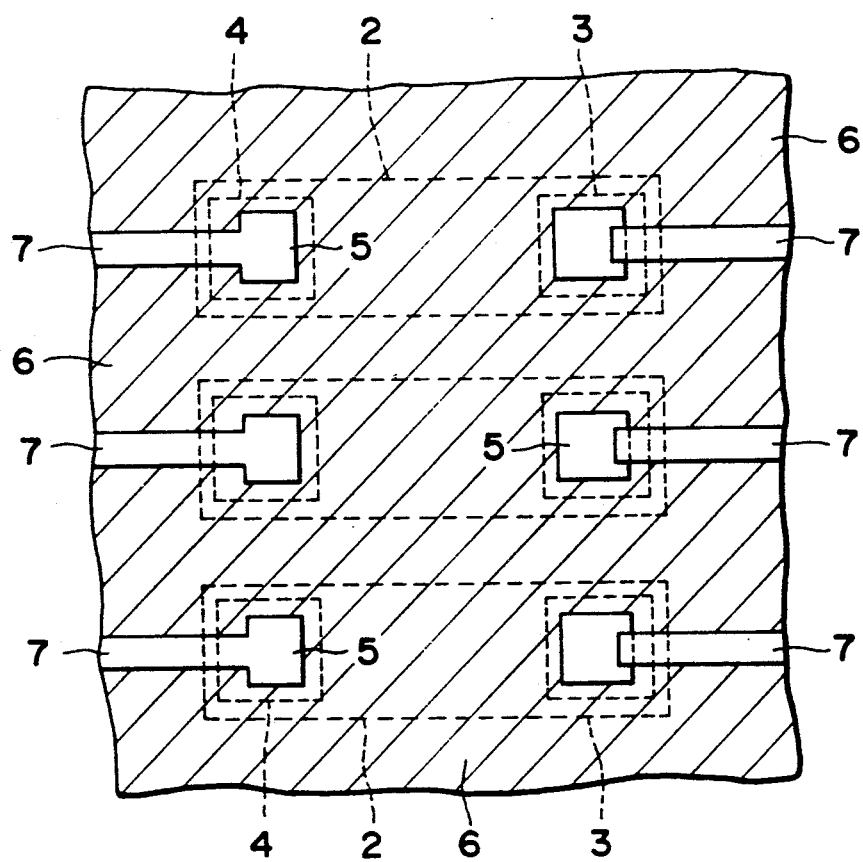
FIG. 2 is a partial plan view of the photoelectric conversion section shown in FIG. 1.
Figure 3:
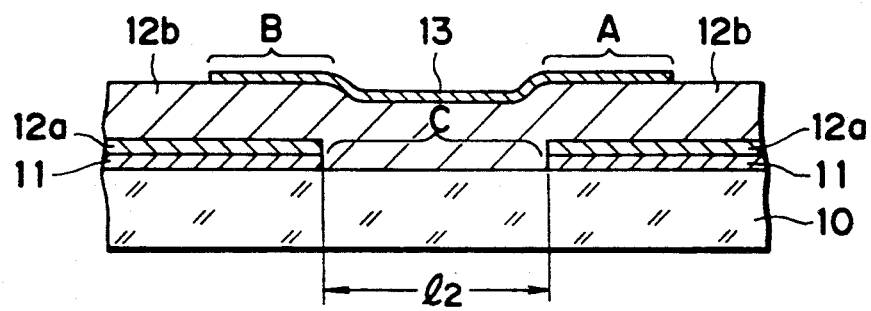
FIG. 3 is a partial sectional view of an embodiment of a photoelectric conversion section of a matrix-drive image sensor as an image sensor according to the present invention.
Figure 4:
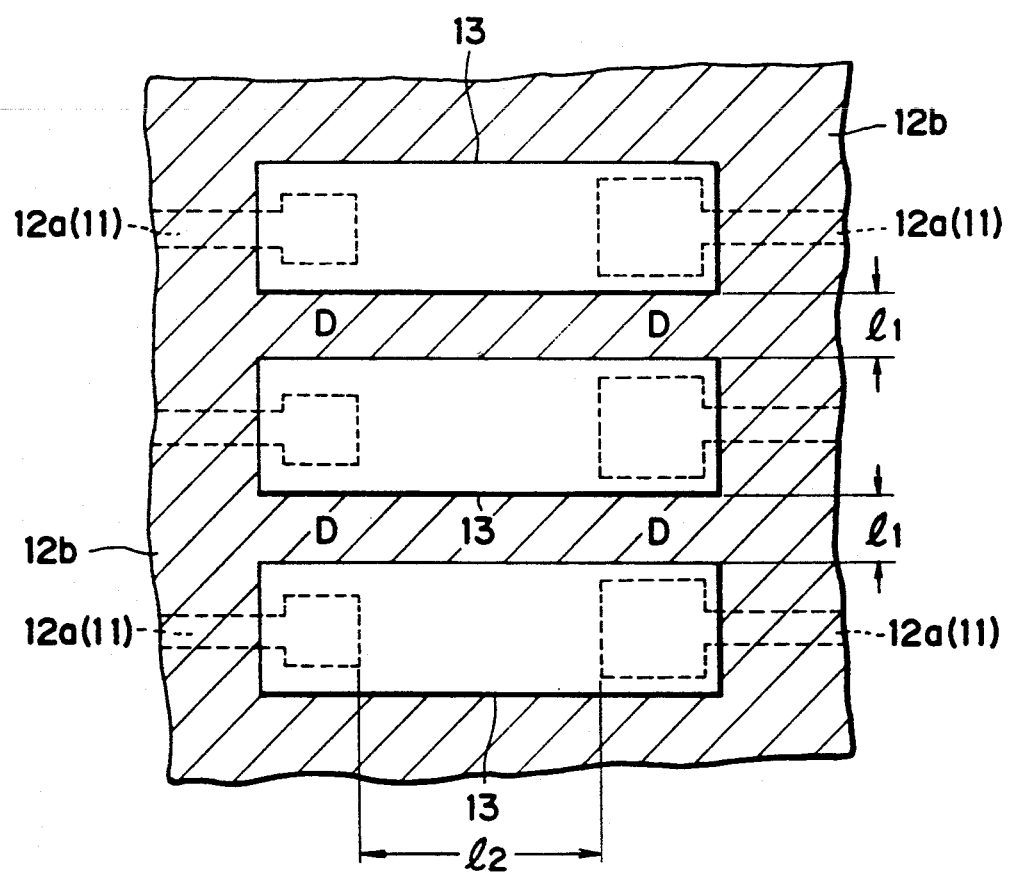
FIG. 4 is a partial plan view of the photoelectric conversion section shown in FIG. 3.

FIG. 3 is a sectional view of an embodiment of a photoelectric conversion section of a matrix-drive image sensor, and FIG. 4 is a partial plan view of the photoelectric conversion section shown in FIG. 3.

A fabricating process of a photoelectric conversion section will be described below. A 1,000-Å thick lower Cr electrode (ohmic contact electrode) 11 is formed on a glass substrate 10 by sputtering or vacuum deposition. Subsequently, a 1,000-Å thick n+-type amorphous silicon thin film 12a is formed on the electrode 11 by CVD. The lower electrode 11 may be formed of Al or Ti in place of Cr. The film thickness of the n+-type amorphous silicon thin film can be 500 Å or more.

Thereafter, the n+-type amorphous silicon thin film 12a and the lower Cr electrode 11 are etched using a first mask pattern. In this case, the n+-type amorphous silicon thin film 12a is etched using a plasma of a gas mixture of $CF_4$ and $O_2$. The Cr electrode 11 can be etched using a solution mixture of ceric ammonium and nitric acid.

A 1 μm thick i-type amorphous silicon thin film 12b and a 1,000-Å thick upper indium-tin-oxide (ITO) electrode (light-receiving side electrode) 13 are successively formed on necessary portions using a deposition mask. The thickness of the light-receiving side electrode can fall within the range of 500 to 2,000 Å.

Finally, the ITO film is etched using a second mask pattern. The ITO film can be etched by a solution mixture of an aqueous solution of ferric chloride and hydrochloric acid. The i-type amorphous silicon thin film 12b is formed by, e.g., plasma CVD, photo CVD, ECR plasma CVD, or the like, and the ITO film is formed by vacuum deposition or sputtering. Note that the total film thickness of the amorphous silicon thin film 12b can fall within the range of 0.5 to 2.0 μm.

In the photoelectric conversion section thus fabricated, an upper portion serves as a light-receiving side. In a portion A in FIG. 3, a photodiode is formed by a Schottky junction formed between the upper electrode 13 and the i-type amorphous silicon thin film 12b. In a portion B in FIG. 3, a blocking diode is formed by a Schottky junction formed between the upper electrode 13 and the i-type amorphous silicon thin film 12b. In addition, an ohmic junction is formed between the lower electrode 11 and the n+-type amorphous silicon thin film 12a. The i-type amorphous silicon thin film 12b according to the present invention can be provided in common to a plurality of or all of photodiodes and blocking diodes. Since the i-type amorphous silicon thin film 12b has a high resistivity, the photodiode and the blocking diode are isolated from each other by a portion C in FIG. 3. As can be seen from FIG. 4, in a region D between adjacent pixels, the diodes are isolated from each other. Therefore, crosstalk of image data between adjacent pixels can be prevented. For example, if a pixel density is 8 pixels/mm, the pitch of the lower electrodes 11 in FIG. 4 is 125 μm, and an interval $l_1$ between adjacent photodiodes is about 10 to 30 μm. On the other hand, if an isolation interval $l_2$ between the adjacent lower electrodes 11 is larger than the interval $l_1$, sufficient isolation can be assured. Since the blocking diode is normally used while being shielded from light, the interval $l_2$ is preferably set to be 1 to 5 mm so as to facilitate light shielding of the blocking diode.

Figure 5:
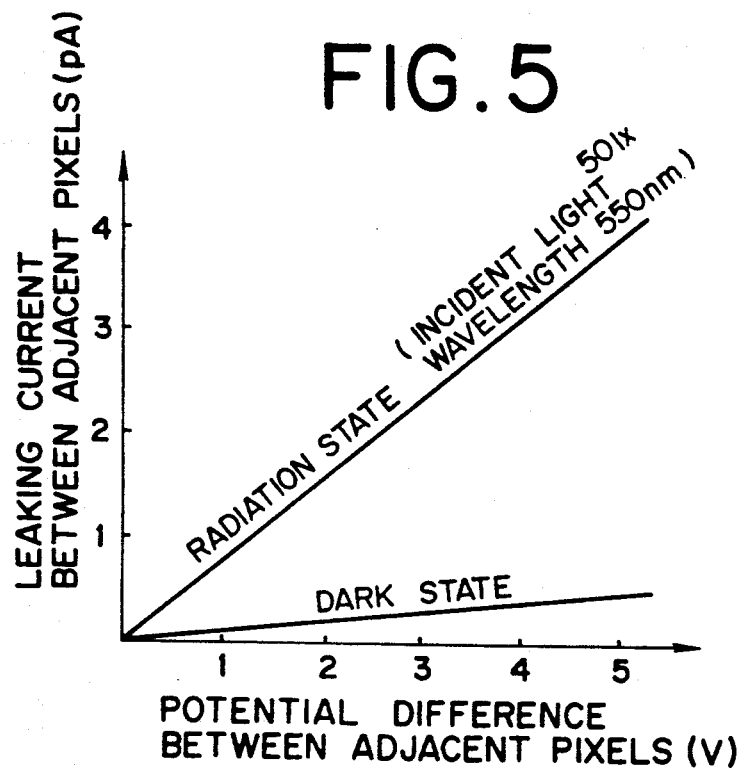
FIG. 5 is a graph showing a leaking current between adjacent pixels of the photoelectric conversion section of the image sensor according to the present invention.
Figure 6:
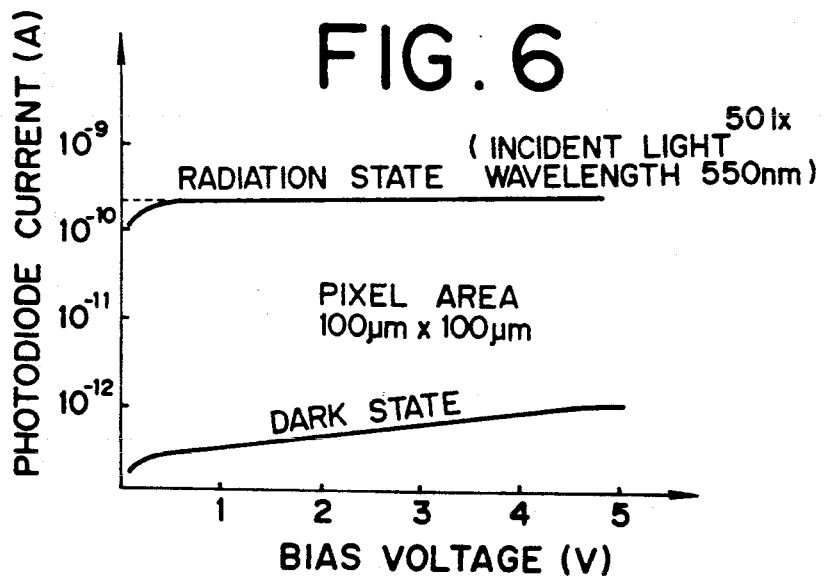
FIG. 6 is a graph showing a photodiode current of the photoelectric conversion section of the image sensor according to the present invention.

FIG. 5 shows a leakage current between adjacent pixels caused by incident light when the photodiode interval $l_1$ is 25 μm. Since a practical drive voltage range is up to 5 V, a leakage current in a practical use state is a maximum of 4 pA, and is sufficiently smaller than a photocurrent of about 300 pA of the photodiode element shown in FIG. 6.

The i-type amorphous silicon thin film 12b is a large pattern extending over the entire surface of the photoelectric conversion section. Therefore, this film can be formed not in a photoresist step but by a deposition mask.

Figure 7:
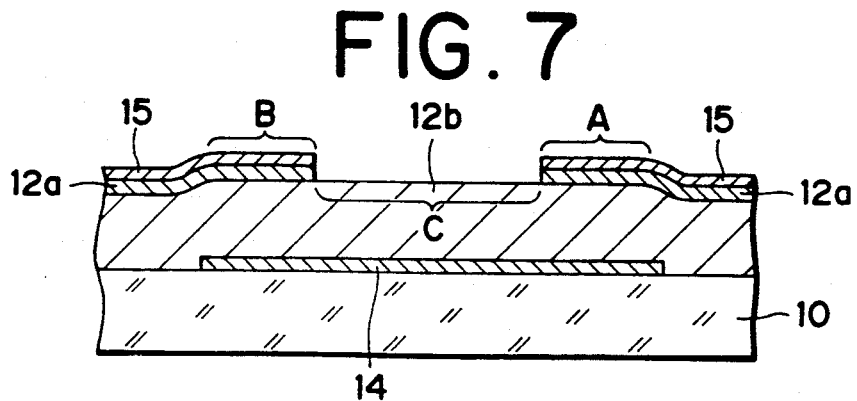
FIG. 7 is a partial sectional view of another embodiment of a photoelectric conversion section of a matrix-drive image sensor as an image sensor according to the present invention.

FIG. 7 is a partial sectional view of another embodiment of a photoelectric conversion section of an image sensor according to the present invention.

In this embodiment, the order of thin film layers is reversed to that in the embodiment shown in FIG. 3, and the same reference numerals in FIG. 7 denote the same layers as in FIG. 3. More specifically, a lower indium-tin-oxide (ITO) electrode (light-receiving side electrode) 14 is formed on a glass substrate 10, and thereafter, an i-type amorphous silicon thin film 12b is formed. An n+-type amorphous silicon thin film 12a and an upper Cr electrode (ohmic contact electrode) 15 are formed on the film 12b to be separated from each other.

The photoelectric conversion section of this embodiment receives incident light from the side of the glass substrate 10, and the same effect as in FIG. 3 can be obtained.

According to the present invention, since each of the photodiode and the blocking diode constituting the photoelectric conversion section of the matrix-drive image sensor is formed by the Schottky junction formed between the amorphous silicon thin film and the light-receiving side electrode, no insulating layer is required unlike in a photoelectric conversion section of a conventional image sensor using an amorphous silicon thin film of a pin structure. Also the number of masks can be reduced, resulting in a simple fabricating process and low cost. Since the pattern of the amorphous silicon thin film is large, a deposition mask can be used without using a photoresist step. Thus, the number of photoresist steps can be reduced, and the fabricating process can be greatly simplified.

What is claim is:

1. An image sensor comprising a plurality of photoelectric transducers arranged in an array on a single substrate and driven by a plurality of matrix wirings, each of said transducers including a photodiode and a blocking diode, each of said photodiodes and said blocking diodes comprising:

a light-receiving side electrode consisting essentially of indium-tin-oxide, said light-receiving side electrode having a thickness within a range of 500 Å to 2,000 Å;

a ohmic contact electrode consisting essentially of an element selected from the group consisting of Cr, Al, and Ti;

a semiconductor layer including an i-type amorphous silicon thin film having a thickness in a range of 0.5 to 2.0 μm and a n+-type amorphous silicon thin film having a thickness not less than 500 Å isolated between at least adjacent photoelectric transducers and sandwiched between said light-receiving side electrode and said ohmic contact electrode, the i-type amorphous silicon thin film being sandwiched between the light-receiving side electrode and the n+-type amorphous silicon thin film and the n+-type amorphous silicon thin film being sandwiched between the i-type amorphous silicon thin film and the ohmic contact electrode, the i-type amorphous silicon thin film being disposed in common to a plurality of the photodiodes and blocking diodes of the plurality of transducers; and each of said photodiodes and said blocking diodes being formed by a Schottky junction disposed between said light-receiving side electrode and said i-type amorphous silicon thin film, wherein said light-receiving side electrode is disposed in common to said photodiode and said blocking diode.

2. An image sensor according to claim 1, wherein said n+-type amorphous silicon thin film has a thickness of 1,000 Å or greater.

* * * * *